(12) United States Patent
Kaeppeler et al.

(10) Patent No.: US 7,048,802 B2
(45) Date of Patent: May 23, 2006

(54) CVD REACTOR WITH GRAPHITE-FOAM INSULATED, TUBULAR SUSCEPTOR

(75) Inventors: Johannes Kaeppeler, Würselen (DE); Frank Wischmeyer, Aachen (DE); Rune Berge, Lund (SE)

(73) Assignee: Aixtron AG (DE)

( * ) Notice: Subject to any disclaimer, the term of this patent is extended or adjusted under 35 U.S.C. 154(b) by 286 days.

(21) Appl. No.: 10/431,080

(22) Filed: May 7, 2003

(65) Prior Publication Data

US 2004/0020436 A1     Feb. 5, 2004

Related U.S. Application Data

(63) Continuation of application No. PCT/EP01/12067, filed on Oct. 18, 2001.

(30) Foreign Application Priority Data

Nov. 7, 2000  (DE) ................................ 100 55 033

(51) Int. Cl.
  *H01L 21/00* (2006.01)
  *C23C 16/00* (2006.01)

(52) U.S. Cl. .................. 118/725; 118/728; 156/345.52; 219/444.1; 219/544; 219/607; 392/416; 392/418; 427/585; 427/591; 427/249.15; 117/200

(58) Field of Classification Search ................ 118/725, 118/728; 156/345.52; 219/444.1, 544, 607; 392/416, 418; 427/585, 591, 249.15; 117/200
See application file for complete search history.

(56) References Cited

U.S. PATENT DOCUMENTS

| | | | | |
|---|---|---|---|---|
| 4,259,278 A | * | 3/1981 | Flegel et al. .................. 264/81 |
| 4,512,391 A | | 4/1985 | Harra .......................... 165/48 |
| 4,927,345 A | * | 5/1990 | Takei et al. ................... 425/77 |
| 5,879,462 A | * | 3/1999 | Kordina et al. ............. 118/725 |
| 6,390,019 B1 | * | 5/2002 | Grimbergen et al. ... 118/723 R |

FOREIGN PATENT DOCUMENTS

| EP | 0 746 009 | | 12/1996 |
|---|---|---|---|
| EP | 1 334 222 B1 | | 10/2001 |
| JP | 60137893 A | * | 7/1985 |
| WO | 90/13687 | | 11/1990 |
| WO | WO 90/13687 | | 11/1990 |
| WO | WO 99/43874 | | 9/1999 |

* cited by examiner

*Primary Examiner*—Ram N Kackar
(74) *Attorney, Agent, or Firm*—St. Onge Steward Johnston & Reens LLC

(57) ABSTRACT

The invention relates to a device for depositing especially crystalline layers on especially crystalline substrates by means of reaction gases fed to a heated process chamber. Said process chamber is formed by the cavity of an especially multi-part graphite tube arranged in a reactor housing that especially comprises quartz walls. Said reactor housing, in the area of the process chamber, is enclosed by a high-frequency coil and the space between the reactor housing wall and the graphite tube is filled with a graphite foam sleeve. In order to improve heat insulation, the graphite foam sleeve is fully slit. The slot is wider than the maximum thermal elongation of the graphite foam sleeve in the peripheral direction to be expected when the device is heated up to process temperature.

5 Claims, 1 Drawing Sheet

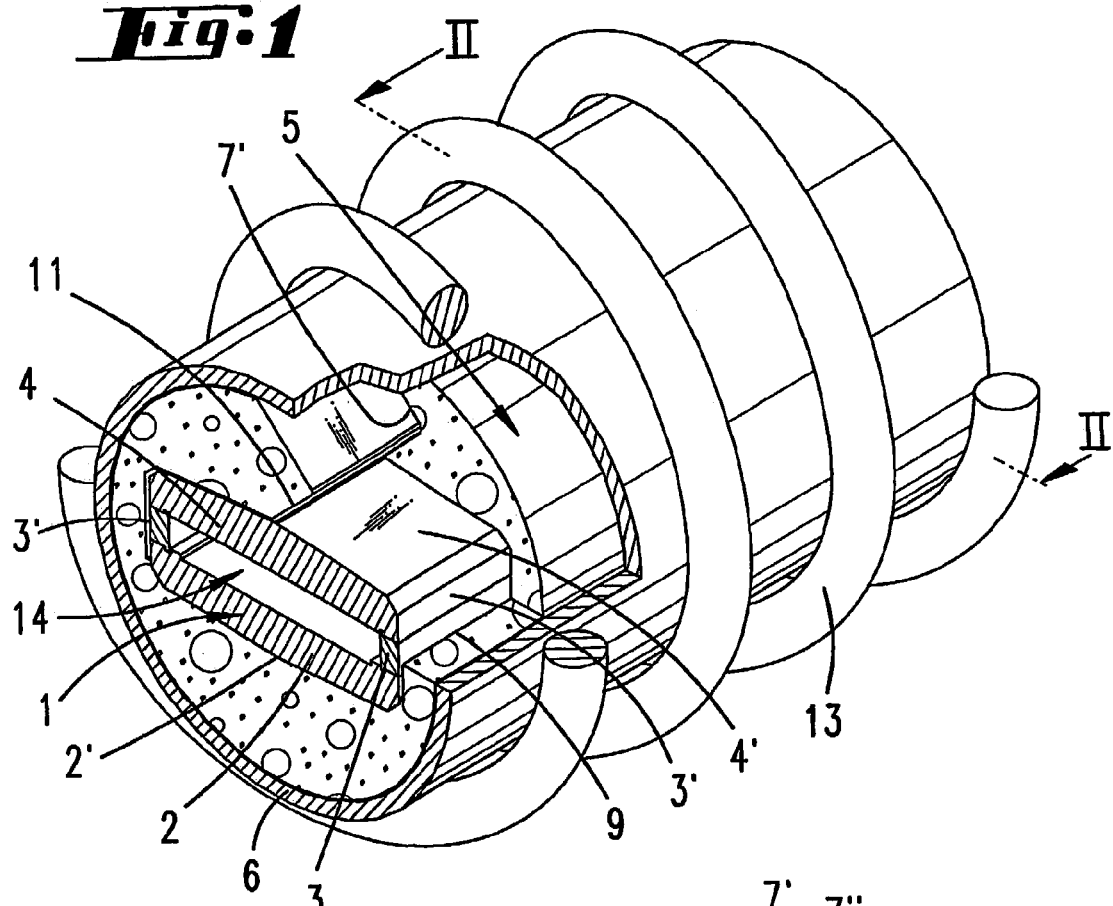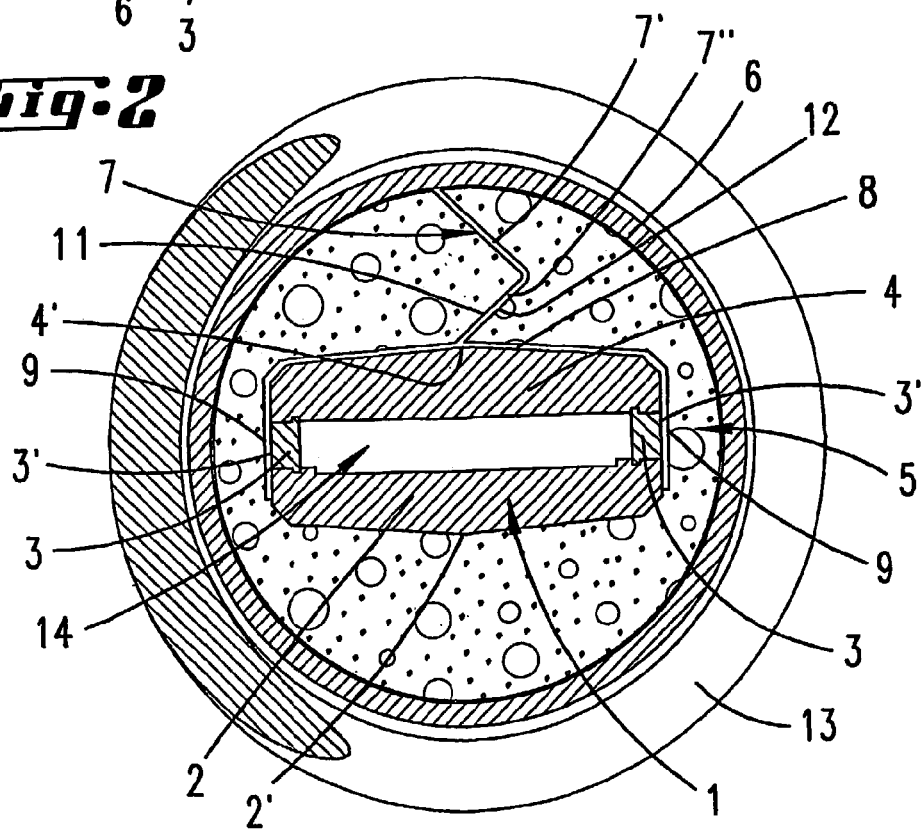

CVD REACTOR WITH GRAPHITE-FOAM INSULATED, TUBULAR SUSCEPTOR

This application is a continuation of pending International Patent Application No. PCT/EP01/12067 filed Oct. 18, 2001, which designates the United States and claims priority of pending German Application No. 10055033.9, filed Nov. 7, 2000.

FIELD OF THE INVENTION

The invention relates to a device for depositing in particular crystalline layers on in particular crystalline substrates by means of reaction gases which are introduced into a heated process chamber, the process chamber being the cavity in an in particular multipart graphite tube which is disposed in a reactor housing which in particular has quartz walls and which is surrounded by a high-frequency coil in the region of the process chamber, the space between the reactor housing wall and the graphite tube being filled by a graphite foam sleeve.

A device of this type is known, for example, from U.S. Pat. No. 5,879,462 A. This document describes a reactor, the housing wall of which is formed by a quartz tube around which an HF coil is disposed. In the region in which the HF coil surrounds the quartz tube, a tube, which is made from graphite and forms the susceptor, is located inside the quartz tube. This graphite tube is sheathed by a sleeve which consists of a graphite foam. The sleeve has a lower thermal conductivity than the graphite tube. The graphite tube is heated by eddy currents generated by the HF field. The graphite foam sleeve is used for thermal insulation.

The invention is based on the object of improving the thermal insulation.

The object is achieved by the invention described in the claims.

Claim 1 provides, first of all and in particular, that the graphite foam sleeve has a continuous slit in the longitudinal direction, the width of the slit being greater than the maximum length expansion of the graphite foam sleeve in the circumferential direction which is to be expected during heating to the process temperature. The device according to the invention is used in particular to deposit SiC layers and can also be used to sublime or anneal SiC layers. The process temperatures there are over 1600° C. On account of the slitted graphite foam sleeve, the induction of eddy currents is considerably reduced there. Since the slit does not close even at the process temperatures, parasitic heating of the graphite foam sleeve used for thermal insulation is substantially prevented even at the process temperatures. Furthermore, the longitudinal slit provided in the graphite foam wall allows slight expansion of the graphite foam sleeve in the circumferential direction. In a preferred configuration of the invention, the longitudinal slit runs substantially parallel to the axis of the graphite foam sleeve. However, the direction of the slit in the radial direction does not run in a straight line, so that it is impossible for any direct radiation to pass from the outer wall of the graphite tube through the slit. The slit is preferably V-shaped. In a refinement of the invention, it is provided that the inner wall of the graphite sleeve which is directly adjacent to the slit is at a gap spacing from the outer wall of the graphite tube. This gap spacing is also greater than the maximum expansion of graphite foam sleeve and graphite tube which is to be expected during heating to the process temperature. Accordingly, this gap is preserved even in the hot state. No temporary heat bridges are formed here between the graphite tube and the graphite foam sleeve. As a result, voltage flashovers and arcs between graphite tube and graphite foam sleeve, which can lead to local heat sources and to material fatigue, are prevented. In a preferred configuration, the graphite tube has a substantially rectangular cross section, three outer walls of this rectangular graphite tube lying at a gap spacing from the sleeve inner wall. The slit may in this case be on the opposite side from the sleeve inner wall which is in physical contact with the graphite tube. The gap width or the slit width may be between 0.5 and 1 mm.

BRIEF DESCRIPTION OF DRAWINGS

An exemplary embodiment of the invention is explained below with reference to appended drawings, in which:

FIG. 1 shows a perspective illustration, partially cut away, of a section through an exemplary embodiment of the invention, and FIG. 2 shows a section on line II—II in FIG. 1.

DETAILED DESCRIPTION OF DRAWINGS

The CVD reactor has a quartz tube 6 which forms the reactor wall. Inside the quartz tube, approximately in its center and extending in the direction of the axis of the cylindrical quartz tube 6, there is a graphite tube 1, which forms the susceptor. In the exemplary embodiment, the graphite tube 1 comprises a total of four parts, namely a base 2, which, by means of its outwardly curved outer wall 2', bears physically against an inner-wall section of a graphite foam sleeve 5. On the opposite side from the base 2, the graphite tube 1 has a ceiling 4 which is held at a distance from the base 2 by means of two sides 3.

The outer wall of the ceiling 4 is also curved outward.

The cavity which is formed by the base 2, the sides 3 and the ceiling 4 is the process chamber 14.

The graphite tube 1 is spaced apart from the reactor wall 6. The space is filled by a graphite foam sleeve 5. The graphite foam sleeve 5 has a central cavity which is substantially in the shape of the outer contour of the graphite tube 1. However, this cavity is larger, so that only the outer wall 2' of the base is in physical contact with the inner wall of the cavity of the graphite foam sleeve 5. The side walls 3' are located at a gap spacing from the corresponding inner-wall side 9 of the graphite foam sleeve cavity. The ceiling wall 4' of the ceiling 4 which faces away from the base outer wall 2' is also located at a spacing from the ceiling inner wall 8 of the cavity which lies opposite it.

A V-shaped slit, which extends through the entire graphite foam sleeve 5 all the way to the quartz tube 6, begins approximately in the center of the inner wall 8 facing the ceiling 4. The slit 7 runs in a straight line in the longitudinal extent (axial direction) of the graphite tube 1 or the quartz tube 6. In the radial direction, i.e. in the direction of the susceptor 1 toward reactor wall 6, by contrast, the slit 7 does not run in a straight line. It forms two slit sections 7', 7", which run at an angle to one another, so that radiation which is radiated from the ceiling outer wall 4' does not pass directly to the quartz tube 6.

The two slit walls 11, 12 facing toward one another are at a spacing from one another which is such that the slit walls 11, 12 do not come into contact with one another even at the process temperature of more than 1600° C. The slit width is approximately 0.5 to 1 mm. The gap between the graphite tube outer wall and the graphite foam sleeve inner wall has the same width.

The gap associated with the ceiling 4 may be slightly narrower (1.5 mm) than the gap associated with the sides 3 (2 mm).

All the features disclosed are (inherently) pertinent to the invention. The content of disclosure of the associated/appended priority documents (copy of the prior application) is hereby incorporated in its entirety in the disclosure of the application, partly with a view to incorporating features of these documents in claims of the present application.

The invention claimed is:

1. Device for depositing in particular crystalline layers on in particular crystalline substrates by means of reaction gases which are introduced into a process chamber which has been heated to a process temperature, the process chamber being the cavity in an in particular multipart graphite tube which is disposed in a reactor housing which in particular has quartz walls and which is surrounded by a high-frequency coil in the region of the process chamber, the space between the reactor housing wall and the graphite tube being filled by a graphite foam sleeve, characterized in that the graphite foam sleeve has a continuous slit running in the longitudinal and radial directions, the width of the slit being greater than the maximum expansion of the graphite foam sleeve in the circumferential direction which is to be expected during heating to the process temperature, wherein the slit, which runs substantially parallel to the longitudinal extent (axial direction) of the graphite foam sleeve, does not run in a straight line in the radial direction, and wherein the slit has a V-shaped profile.

2. Device according to claim 1, characterized in that, over the entire slit length, the sleeve inner wall section adjacent to the slit is at a gap spacing from the outer wall of the graphite tube which is greater than the maximum expansion of the graphite foam sleeve and of the graphite tube which is to be expected during heating to the process temperature.

3. Device according to claim 1, characterized in that the graphite tube has a substantially rectangular cross section, and three outer walls lie at a gap spacing from the sleeve inner wall.

4. Device according to claim 1, characterized in that the slit is disposed approximately in the center of the graphite foam sleeve wall which is on the opposite side from the graphite tube wall which is in physical contact with the sleeve.

5. Device according to claim 1, characterized in that the slit width and/or the gap width is between 0.5 and 1 mm.

* * * * *